United States Patent [19]

Solomon et al.

[11] Patent Number: 4,866,491

[45] Date of Patent: Sep. 12, 1989

[54] HETEROJUNCTION FIELD EFFECT TRANSISTOR HAVING GATE THRESHOLD VOLTAGE CAPABILITY

[75] Inventors: Paul M. Solomon, Yorktown Heights; Thomas N. Theis, Croton-on-Hudson, both of N.Y.

[73] Assignee: International Business Machines Corporation, Armonk, N.Y.

[21] Appl. No.: 294,979

[22] Filed: Jan. 4, 1989

Related U.S. Application Data

[63] Continuation of Ser. No. 11,799, Feb. 6, 1987, abandoned.

[51] Int. Cl.$^4$ .................................. H01L 29/80
[52] U.S. Cl. ........................................ 357/22; 357/16; 357/58; 357/56; 357/23.1; 357/23.15
[58] Field of Search ................. 357/23.1, 23.15, 22 A, 357/22 MD, 16, 56, 58

[56] References Cited

U.S. PATENT DOCUMENTS

| | | | |
|---|---|---|---|
| 4,075,652 | 2/1978 | Umebachi et al. | 357/22 A |
| 4,151,635 | 5/1979 | Kashkooli et al. | 357/42 X |
| 4,583,105 | 4/1986 | Rosenberg | 357/16 X |
| 4,729,000 | 3/1988 | Abrokwah | 357/16 X |
| 4,737,827 | 4/1988 | Ohta | 357/22 A X |
| 4,755,858 | 7/1988 | Thompson et al. | 357/22 A |

FOREIGN PATENT DOCUMENTS

| | | | |
|---|---|---|---|
| 0114962 | 8/1984 | European Pat. Off. | |
| 0184827 | 6/1986 | European Pat. Off. | 357/22 A |
| 0256363 | 2/1988 | European Pat. Off. | |
| 61-99379 | 5/1986 | Japan | 357/22 MD |

OTHER PUBLICATIONS

Umebachi et al., "A New Heterojunction-Gate GaAs FET", *Supplement to Jap. Jour. of Appl. Phys.*, vol. 15, 1976, pp. 157-161.
Judapprawira et al., "Modulation-Doped MBE GaAs/n-Al$_x$Ga$_{1-x}$As MESFETs", *IEEE Electron Device Letters*, vol. EDL-2, No. 1, Jan. 1981, pp. 14-15.
Thorne et al., "Performance of Inverted Structure Modulation Doped Schottky Barrier Field Effect Transistors", *Jap. Jour. of Appl. Phys.*, vol. 21, No. 4, Apr. 1982, pp. 1223-1224.
Hiyamizu, "MBE-Grown AsAs/n-Al GaAs Heterostructures and Their Application to High Electron Mobility Transistors", *Jap. Jour. of Appl. Phys.*, vol. 21, (1982), Supplement 21-1, pp. 161-168.
Lee et al., "High Temperature Annealing of Modulation Doped GaAs/AlGaAs Heterostructures for FET Applications", *Proceedings IEEE/Cornel Conference on High-Speed Semiconductor Devices & Circuits*, Aug. 15-17, 1983, pp. 204-208.
Sholley, et al., "HEMT mm-Wave Amplifiers, Mixers and Oscillators", Microwave Journal, 28 No. 8, Aug. 1985, pp. 121-130.
Patent Abstracts of Japan, vol. 10, No. 379, A 61 171 170, "Semiconductor Device", Dec. 18, 1986.
Patent Abstracts of Japan, vol. 10, No. 386, A 61 176 161, "Heterogate Field-Effect Transistor", Dec. 24, 1986.
Mimura, et al., "A New Field-Effect Transistor with Selectively Doped GaAs/n-Al$_x$Ga$_{1-x}$As Heterojunctions", Japanese Journal of Applied Physics, vol. 19, No. 5, May 1980, pp. L225-L227.
Umebachi, et al., "A New Heterojunction Gate GaAs FET", IEEE Transistions on Electron Devices, Aug. 1975, pp. 613-614.
Morkoc, et al., "Submicrometre Al$_{0.5}$Ga$_{0.5}$As Heterojunction Gate GaAs F.E.T.", Electronics Letters, Aug. 4, 1977, vol. 13, No. 6.
Solomon, et al., "A GaAs Gate Heterojunction FET", IEEE Electron Device Letters, vol. EDL-5, No. 9, Sep. 1984, pp. 379-381.
Caine, et al., "Staggered-Lineup Heterojunctions as Sources of Tunable Below-Gap Radiation: Experimental Verification", Appl. Phys. Lett. 45(10), 11/15/84.

*Primary Examiner*—William Mintel
*Attorney, Agent, or Firm*—Pollock, Vande Sande & Priddy

[57] ABSTRACT

A field effect transistor comprising a semiconductor channel region; an undoped semiconductor material region adjacent the channel region; a second semiconductor material region separated from the channel region; and a region of semiconductor material adjacent the second region and having a narrower band gap than the band gap of the region adjacent the channel region; and ohmic contact means to the region having the narrower band gap.

19 Claims, 1 Drawing Sheet

HETEROJUNCTION FIELD EFFECT TRANSISTOR HAVING GATE THRESHOLD VOLTAGE CAPABILITY

This application is a continuation of Ser. No. 011,799, filed Feb. 6, 1987, now abandoned.

TECHNICAL FIELD

The present invention is concerned with a monocrystalline semiconductor gate heterojunction field effect transistor that has different gate threshold voltage capability. Moreover, the present invention is concerned with a heterojunction FET device wherein the contact to the gate is an ohmic contact. In accordance with the present invention, the gate has a higher barrier one way than the other way. In other words, the present invention provides for an asymmetric barrier. The present invention makes it possible to provide a depletion mode device on the same substrate as the enhancement mode device without compromising the threshold control properties or electron transport properties of either device.

BACKGROUND OF THE INVENTION

Heterojunction field effect transistors that are capable of operating at relatively low temperatures and at extremely fast switching times such as less than 10 picoseconds have been suggested. Such FET devices have been referred to as High Electron Mobility Transistors (HEMT). The high switching speed obtainable is due to the high channel mobility at relatively low temperatures.

For instance, such heterojunction field effect transistors are reported in Japanese Journal of Applied Physics, Volume 19, No. 5, May 1980, pp. L225–L227, "A New Field-Effect Transistor With Selectively Doped GaAs/N-Al$_x$Ga$_{1-x}$As Heterojunctions" by Mimura, et al. The device suggested therein includes a pair of undoped gallium arsenide layers sandwiching a layer of silicon doped gallium aluminum arsenide. A rectifying contact for the gate is provided by deposition of aluminum on the surface of the non-doped gallium arsenide of the top layer. Such devices, however, could stand improvement with respect to the threshold voltage in not being as controllable as desired. Devices with controllable, low threshold voltages are essential for logic circuits having reduced power supply voltages. To the extent that a Schottky or rectifying contact to the gate is employed, a critically designed doped layer is required to obtain a near zero threshold voltage.

Hiyamizo, et al., "Extremely High Mobility of 2-Dimensional Electron Gas in Selectively Doped GaAs/N-AlGaAs Heterojunction Structures Grown by MBE", Japanese Journal of Applied Physics, Volume 20, No. 4, Apr. 1981, pp. L245–L248 report a selectively doped heterojunction structure wherein an undoped gallium aluminum arsenide layer is deposited on top of an undoped gallium arsenide layer. A silicon doped gallium aluminum arsenide layer is disposed over the undoped gallium aluminum arsenide layer and an ohmic contact is made by applying Au-Ge to the contact areas including the mesa edges where the GaAs/N-AlGaAs interface is exposed. This structure is primarily to investigate the accumulation of a two-dimensional electron gas at the interface of the heterojunction. Also suggested therein is an Enhancement Mode High Electron Mobility Transistor (E-HEMT) that incorporates an undoped gallium arsenide layer; an undoped gallium aluminum arsenide layer; and a silicon doped gallium aluminum arsenide layer. Ohmic contacts are applied to the source and drain regions, and an aluminum Schottky gate is applied to the silicon doped gallium aluminum arsenide upper layer. The threshold voltage exhibited for such device at room temperature was zero and at 77° C was 0.19 volts. While such arrangement exhibits a threshold voltage that lies near zero, the characteristics of the device are not very controllable in that very stringent control of both layer thickness and doping level is required to obtain the desired threshold voltage. This type of extreme care is undesirable and should be avoided in production processes where high yields are required.

U.S. Pat. No. 4,151,635 to Kashkooli, et al. suggests a P-channel MOS device formed in a first region and an N-channel MOS device formed in a second region. Each of the P-channel and N-channel devices has a polycrystalline silicon gate structure in which the polycrystalline silicon material is doped with a P-type impurity to make possible the matching of the threshold voltages of both of the devices. Such devices are insulated gate field effect transistors.

U.S. Pat. No. 4,075,652 to Umebachi, et al. suggests a heterojunction type GaAs junction field effect transistor. The channel region consists of an N-type gallium arsenide layer with a higher mobility and a gate region that consists of a P-type gallium arsenide layer that is grown heteroepitaxially. The gate, source, and drain regions are self-aligned and the drain electrodes are formed of a metal such as aluminum. The gate junction is provided by the P-N junction between the first and second layers and the conductivity in the first layer is controlled by the electric field in the second layer. A third layer of the same conductivity type as the second layer forms an extension of the second layer and an ohmic contact of aluminum is formed on the gate extension.

Umebachi, et al., "A New Heterojunction Gate GaAs FET", IEEE Transaction on Electron Devices", August 1975, p. 613, suggests a structure that is similar to the one in U.S. Pat. No. 4,075,652 wherein source, drain, and gate contacts of gold-germanium eutectic are employed. U.S. Pat. No. 4,583,105 issued Apr. 15, 1986 to Rosenberg, disclosure of which is incorporated herein by reference, discloses a heterojunction field effect transistor having a threshold voltage that lies near zero volts. The heterojunction field effect transistor disclosed therein employs a semiconductor gate to which an ohmic contact can be made.

In particular, the device disclosed in U.S. Pat. No. 4,583,105 is concerned with a double heterojunction field effect transistor that utilizes a substrate on which a first layer of single crystal semiconductor material such as gallium arsenide or germanium is epitaxially deposited. Such also employs a barrier element of a single crystal semiconductor material such as gallium aluminum arsenide that forms a heterojunction with the first layer. The band energy difference between the latter and the barrier element has a given barrier height. Means are disposed on the barrier element for controlling at least the band edge of the first layer adjacent the heterojunction so that it lies near the fermi level. The means has the same potential as the source and, relative to the barrier element, has a barrier height equal to the given barrier height. The means for controlling includes a single crystal semiconductor gate of a III-IV compound such as gallium arsenide to which an ohmic contact can be made as a result of its heavy N-conductivity type doping. In addition, the device disclosed in said patent application has a semiconductor gate to which an ohmic contact such as gold-germanium can be made. The double heterojunction transistor device therein is an enhancement mode device which, in the absence of any doping in its barrier layer, has a threshold voltage which normally lies near zero.

SUMMARY OF INVENTION

The present invention is concerned with a semiconductor heterojunction field effect transistor that exhibits different gate threshold voltage capability. The present invention employs a wider band gap material and narrower band gap material, respectively. These materials together are located between an ohmic contact and the channel and act as a gate in the heterojunction field effect transistor.

In particular, the present invention is concerned with a monocrystalline semiconductor heterojunction field effect transistor having different gate threshold voltage capability. The transistor includes a semiconductor channel region and a first undoped semiconductor material region adjacent the channel region and having a wide band gap. A second region with narrower band gap than the first region of semiconductor material different from the first semiconductor material region is present and is separated from the channel region by the first undoped semiconductor region. The second region can be doped or undoped depending upon the desired final device. A third region of semiconductor material having a narrower band gap than the band gap of the second semiconductor material region is located adjacent the second region. Ohmic contact means are provided to the third region of semiconductor material.

The ability to selectively dope the second region makes it possible to provide for a depletion mode device on the same substrate as an enhancement mode device without compromising the threshold properties or electron transport properties of either device or to provide a complementary device depending upon the type of doping employed.

BEST AND VARIOUS MODES FOR CARRYING OUT INVENTION

For convenience, the discussion which follows is directed to the preferred aspect of the present invention of an N-channel heterojunction field effect transistor. However, it is understood that when the discussion refers to n-type impurities, the present invention is applicable to p-type impurities and vice versa.

Moreover, for convenience, the discussion that follows is directed to the preferred aspects of the present invention that employ gallium arsenide and gallium aluminum arsenide layers; it being understood that the present invention is applicable to other semiconductor materials such as other III-V intermetallic compounds.

Figure 1:
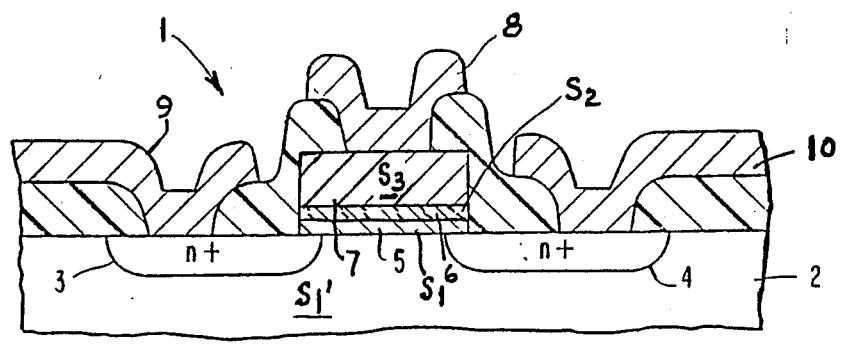
FIG. 1 is a schematic cross-sectional view of a heterojunction field effect transistor in accordance with the present invention.

Referring to FIG. 1, there is shown a schematic cross-sectional view of an N-channel heterojunction field effect transistor in accordance with the present invention. In FIG. 1, heterojunction field effect transistor (1) comprises a substrate (2) such as undoped gallium arsenide. Other substrates include semiconductor materials such as III-V compounds. As a result of background doping during growth, substrate (2) may be slightly doped such as with a P-conductivity type dopant without deleterious effect. Layer (2) is a single crystalline layer of gallium arsenide which has been epitaxially grown on a layer of semi-insulating gallium arsenide (not shown) or other suitable substrate.

Source and drain regions (3), (4), respectively, are shown disposed in layer (2).

Regions (3), (4) are doped with an N-conductivity type dopant such as silicon by, for instance, ion implantation. A channel region of N-conductivity type is formed between regions (3), (4) when the appropriate potentials are applied to the transistor device (1). Layer (2) is otherwise identified in FIG. 1 as S1'.

In FIG. 1 a barrier element (5) of, for instance, undoped gallium aluminum arsenide is illustrated overlying the channel region between source and drain regions (3), (4), respectively. Barrier layer (5) can be formed from an epitaxially deposited layer of gallium aluminum arsenide by molecular beam epitaxy (MBE) as well-known to those skilled in the art.

When layer (5) is aluminum gallium arsenide, it can be represented by the formula $Al_xGa_{1-x}As$ wherein x is a value of about 0.3 to about 0.6, a typical value being about 0.5.

In FIG. 1 a layer (6) is shown disposed over barrier element (5). Layer (6) is of semiconductor material preferably of the same constituents as in barrier layer (5), except that the relative amounts of the constituents are different. Preferably, layer (6) is aluminum gallium arsenide. Such can be represented by the formula $Al_yGa_{1-y}As$ wherein y is a value of about 0 to about 0.3, typically about 0.25. The value of y must be less than that for x in the formula shown for layer (5). Layer 6 can be doped or undoped depending upon the desired device. If it is desired to provide for a depletion mode device on the substrate in addition to the enhancement mode device, layer (6) is doped with an n-type species such as silicon. Typical levels of such doping are $10^{17}$ to about $10^{19}$ atoms/cm$^3$.

The presence of layer (6) provides for versatility in that different types of devices can be provided depending upon whether layer (6) is undoped or selectively doped. For instance, as discussed above, heavily n-doping layer (6) makes it possible to achieve devices of the present invention whereby a depletion mode device is provided along with an enhancement mode device on the same substrate without compromising the threshold voltage control properties or electron transport properties of either device. The layer (6) can be provided by well-known methods of deposition such as MBE. The doping when employed can be provided, for instance, by ion-implantation or diffusion.

Adjacent and atop layer (6) is a gate layer (7). Gate layer (7) is preferably an intermetallic semiconductor material such as a III-V material and preferably is a single crystal layer of gallium arsenide. Layer (7) is heavily doped with an N-conductivity type such as silicon and is doped to include about $10^{16}$ to about $10^{19}$ atoms/cm³ and preferably about $2 \times 10^{18}$ atoms/cm³. The layer (7) can be provided by being deposited by MBE techniques, as well-known to those skilled in the art.

Atop gate (7) is an ohmic contact means (8) such as a metal including gold-germanium.

In FIG. 1 are shown metal contacts (9) and (10) contacting source region (3) and drain region (4), respectively. Contacts (9), (10) form ohmic contacts with regions (3), (4), respectively, and may be made of alloyed gold-germanium, for instance.

Barrier element (5) is otherwise identified in FIG. 1 as layer ($S_1$), layer (6) is otherwise identified in FIG. 1 as layer ($S_2$), and layer 7 is otherwise identified in FIG. 1 as layer ($S_3$).

Preferably, layer (2) and gate layer (7) are made of the same material and that the dopant of gate layer (7) is the same as the type of carrier supplied to the channel region. In the preferred aspects of the present invention wherein gate layer (7) and layer (2) are of the same material, the barrier heights of these layers relative to the barrier element are, therefore, equal. However, it is contemplated that materials of layers (2) and (7) need not be the same. For instance, layer (7) could be made from germanium doped with an N-conductivity type dopant such as arsenic or antimony.

Also, it is preferred but not necessary, that the layers (5) and (6) be of the same constituents and preferably be gallium aluminum arsenide with differing relative amounts of the constituents. In particular, the amounts of aluminum and gallium in the two layers are different. In particular, the mole fraction of the aluminum in the aluminum gallium arsenide layer (6) is lower than that in the insulating aluminum gallium arsenide layer (5). As a consequence, the barrier from the gate to the insulator, $\Phi_1$, is lower than that from the channel to insulator, $\Phi_2$. This gate structure results in a threshold voltage of about $\Phi_1 - \Phi_2$ which will be negative. When n-type doped, the FET will include a depletion mode with a well-controlled threshold voltage.

Figure 2:
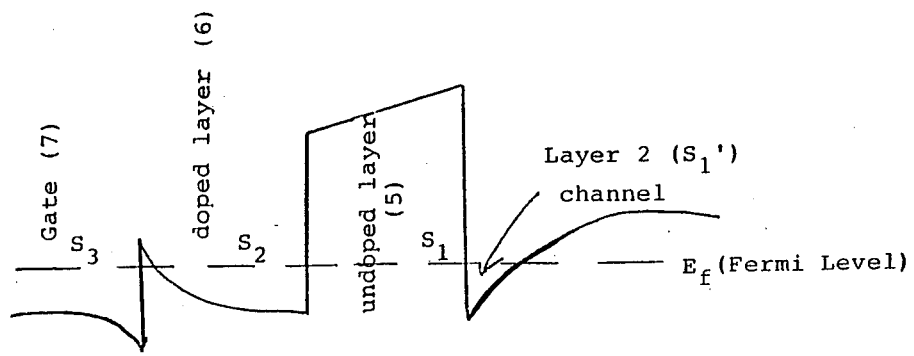
FIG. 2 is a band energy diagram showing the step barrier shape achieved pursuant to the present invention when the second region is doped.

FIG. 2 shows a band energy diagram of the device (1) of FIG. 1 when layer (6) is doped with n-type dopant. The reference numerals and characters utilized in FIG. 1 identify the same elements when they are utilized in FIG. 2. The residual barrier between the layer (2) and layer (3) presents no appreciable obstacle to current flow in view of the low barrier height and high doping as illustrated in FIG. 2.

Figure 3:
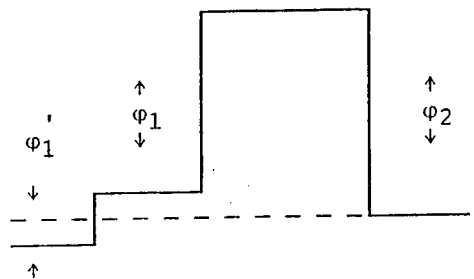
FIG. 3 is a band energy diagram achieved pursuant to the present invention when the second region is undoped.

FIG. 3 shows a band energy diagram of the device (1) of FIG. 1, when layer (6) is undoped. The gate to insulator barrier is $\phi + \phi_1'$ where, by transactivity, $\phi_1 + \phi_1' = \phi_2$, just as if the step were absent.

While the foregoing discussion has focused on N-channel field effect transistors, it should be appreciated that P-channel field effect transistors which have the same basic structure as that shown in FIG. 1, except that layer (2) would be undoped or possess a slight N-conductivity type background doping, regions (3), (4) would be P-conductivity type, layer (7) would be heavily doped with a P-conductivity type dopant and ohmic contacts (8), (9), and (10) would be appropriate for the material to which a contact is made. Layer (6) would be doped or undoped and to provide a depletion mode device would be doped with p-conductivity type. With respect to the materials involved in a P-channel device, layer (2) may be GaAs, layer (5) undoped AlAs, layer (6) doped or undoped $Ga_yAl_{1-y}As$ where y varies from 0 to 1 with 0.5 preferred, layer (7) GaAs doped with beryllium or zinc, regions (3), (4) magnesium doped, and ohmic contacts (7), (8) and (9) zinc doped with gold.

In another N-channel embodiment, layer (2) is germanium, layer (5) is gallium aluminum arsenide, layer (6) is doped or undoped gallium aluminum arsenide having different relative amounts of gallium and aluminum, layer (7) is germanium doped with arsenic or antimony, regions (3), (4) are doped with arsenic or antimony, and contacts (7), (8), and (9) are made of indium or tin. In another P-channel embodiment, layer (2) is germanium, layer (5) is gallium aluminum arsenide, layer (6) is doped or undoped gallium aluminum arsenide having different relative amounts of gallium and aluminum compared to layer (5), layer (7) is gallium arsenide doped with beryllium regions (3), (4) are doped with gallium, and contacts (7), (8), and (9) are made of indium or tin.

Devices of the present invention may be fabricated using steps, many of which are well-known to those skilled in the semiconductor fabrication arts.

Layers (2), (5), (6), and (7) may be grown by molecular beam epitaxy (MBE). Layers (2) and (7) are preferably of gallium arsenide, GaAs. Layer (5) is preferably of gallium aluminum arsenide, $Al_xGa_{1-x}As$, wherein x is about 0.3 to about 0.6 and preferably about 0.5. Layer (6) is preferably gallium aluminum arsenide, $Al_yGa_{1-y}As$, wherein y is 0 to about 0.3 and preferably about 0.25. Layers (2), (5), (6), and (7) may be grown on a substrate such as a semi-insulating gallium arsenide or other suitable substrate. During deposition, upper gallium arsenide layer (7) is heavily doped ($\geq 2 \times 10^{18}$ atoms/cm$^{-3}$) with an N-conductivity type dopant such as silicon. Gallium aluminum arsenide layer (6) can also be heavily doped ($10^{17}$ to about $10^{19}$ atoms/cm³, if desired, depending upon the desired device) such as with an N-conductivity type dopant such as silicon. Layer 7 should be doped as heavily as possible and have a thickness such that band bending from the ohmic contact does not penetrate to the heterojunctions between layer (6) and layer (5). Typical thicknesses of layer (7) are about 10 to about 500 nanometers, of which about 20 nanometers is typical. Layer (6) is about 10 to about 30 nanometers, of which about 20 nanometers is typical. Layer (5) is usually about 15 to about 100 nanometers thick, of which 30 nanometers is typical. Layer (2) is usually about 0.2 to about 20 microns thick, of which about 1 micron is typical.

In a subsequent step a portion of upper gallium arsenide layer (7) is selectively etched using well-known photolithographic and etching techniques to remove gallium arsenide everywhere, except under a masked portion. A selective etch such as $NH_4OH/H_2O_2$ selectively etches the gallium arsenide.

Layers (5) and (6) are selectively etched employing a selective etchant such as HF, which selectively etches gallium aluminum arsenide. These etching steps form a self-aligned semiconductor gate and barrier element disposed over what will become the channel region of the device.

Using layers (7), (6), and (5) as a mask, along with other appropriate masking by photoresist, for example, source and drain regions (3), (4), respectively, are ion implanted with an N-conductivity type dopant such as silicon. Source and drain regions (3), (4), respectively, have a doping level of $\geq 10^{18}$ atoms/cm$^{-3}$. Layer (5), in general, should be thick enough to prevent excessive current flow between layer (7) and layer (2), but should be thin enough to maintain acceptably high transconductance. A minimal thickness is about 15 nanometers, while a preferred thickness range of about 15 to about 100 nanometers may be used.

After ion implanting, an insulation layer of silicon dioxide, for example, is deposited on the exposed surfaces by well-known chemical vapor deposition technique. Contact holes for ohmic contacts to source, gate, and drain regions (3), (7) and (4), respectively, are formed using well-known photolithographic and etching techniques.

Ohmic contacts are formed on source, drain, and gate regions (3), (7), and (4), respectively, by depositing a metal such as gold-germanium which forms an alloy ohmic contact with each of these regions. After deposition of the metal, the contacts are defined by well-known photolithographic masking and etching techniques and are alloyed. A structure similar to that shown in FIG. 1 is provided.

Having thus described our invention, what we claim as new and desire to secure by Letters Patent is:

1. A monocrystalline semiconductor heterojunction field effect transistor having a selectively controlled gate threshold voltage comprising:
a substrate having doped source and drain regions with a doping level of $\geq 10^{18}$ atoms/cm$^3$, and a semiconductor channel region located between said source and drain regions; a gate insulator comprising a first undoped semiconductor material region adjacent said channel region and having a wide band gap; a threshold voltage controlling layer comprising a second region of semiconductor material with a narrower band gap than said first undoped semiconductor region and being different from said first undoped semiconductor material region and being separated from said channel region by said gate insulator and being doped with about $10^{17}$ to about $10^{19}$ atoms/cm$^3$ and being a gate region; a third region of semiconductor material being doped with at least $2 \times 10^{18}$ atoms/cm$^3$ and being adjacent said threshold voltage controlling voltage layer and having a narrower band gap than the band gap of said threshold voltage controlling layer and being a gate region; and ohmic contact means to said third region.

2. The transistor of claim 1 wherein said semiconductor channel region includes a III-V material.

3. The transistor of claim 2 wherein said III-V material is gallium arsenide.

4. The transistor of claim 1 wherein said first undoped semiconductor material is of undoped gallium aluminum arsenide.

5. The transistor of claim 4 wherein said second region is doped gallium aluminum arsenide.

6. The transistor of claim 1 wherein the first undoped semiconductor material and the second region of semiconductor material contains the same metallic elements in different relative amounts.

7. The transistor of claim 6 wherein said first undoped semiconductor material is represented by the formula:

$$Al_xGa_{1-x}As$$

wherein x is about 0.3 to about 0.6, and said second region is represented by the formula:

$$Al_yGa_{1-y}As$$

wherein y is about 0 to about 0.3, and wherein y is less than x.

8. The transistor of claim 7 wherein said channel region and said third region are of gallium arsenide.

9. The transistor of claim 1 wherein said threshold voltage controlling layer is about 10 to about 30 nanometers thick and said gate insulator is about 15 to about 100 nanometers thick.

10. The transistor of claim 9 wherein said third region is about 10 to about 500 nanometers thick.

11. A monocrystalline semiconductor heterojunction field effect transistor having a selectively controlled gate threshold voltage comprising:
a substrate having doped source and drain regions with a doping level of $\geq 10^{18}$ atoms/cm$^3$, and a semiconductor channel region located between said source and drain regions; a gate insulator comprising a first undoped semiconductor material region adjacent said channel region and having a wide band gap; a threshold voltage controlling layer comprising a second undoped region of semiconductor material with a narrower band gap than said first undoped semiconductor region and being different from said first undoped semiconductor material region and being separated from said channel region by said gate insulator and being an insulator; a third region of semiconductor material being doped with at least $2 \times 10^{18}$ atoms/cm$^3$ and being adjacent said threshold voltage controlling layer and having a narrower band gap than the band gap of said threshold voltage controlling layer and being a gate region; and ohmic contact means to said third region.

12. The transistor of claim 11 wherein said semiconductor channel region includes a III-V material.

13. The transistor of claim 12 wherein said III-V material is gallium arsenide.

14. The transistor of claim 11 wherein said first undoped semiconductor material is of undoped gallium aluminum arsenide.

15. The transistor of claim 11 wherein the first undoped semiconductor material and the second region of semiconductor material contains the same metallic elements in different relative amounts.

16. The transistor of claim 15 wherein said first undoped semiconductor material is represented by the formula:

$$al_xGa_{1-y}As$$

wherein y is about 0 to about 0.3, and wherein y is less than x.

17. The transistor of claim 16 wherein said channel region and said third region are of gallium arsenide.

18. The transistor of claim 11 wherein said threshold voltage controlling layer is about 10 to 30 nanometers thick and said gate insulator is about 15 to about 100 nanometers thick.

19. The transistor of claim 18 wherein said third region is about 10 to about 500 nanometers thick.

* * * * *